(12) United States Patent
Uno et al.

(10) Patent No.: US 11,569,434 B2
(45) Date of Patent: Jan. 31, 2023

(54) VIBRATING PLATE-BONDED-BODY

(71) Applicant: NGK INSULATORS, LTD., Nagoya (JP)

(72) Inventors: Yudai Uno, Nagoya (JP); Tomoyoshi Tai, Inazawa (JP); Keiichiro Asai, Nagoya (JP); Masato Niwa, Inuyama (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/452,491

(22) Filed: Oct. 27, 2021

(65) Prior Publication Data

US 2022/0052251 A1    Feb. 17, 2022
US 2022/0393094 A9    Dec. 8, 2022

Related U.S. Application Data

(63) Continuation of application No. PCT/JP2020/045500, filed on Dec. 7, 2020.

(30) Foreign Application Priority Data

Dec. 18, 2019 (JP) .............. JP2019-228202

(51) Int. Cl.
*H01L 41/18* (2006.01)
*H01L 41/09* (2006.01)
(Continued)

(52) U.S. Cl.
CPC ............ *H01L 41/09* (2013.01); *H01L 41/187* (2013.01); *G02B 26/0858* (2013.01)

(58) Field of Classification Search
CPC .... H01L 41/06; H01L 41/187; G02B 26/0858
See application file for complete search history.

(56) References Cited

U.S. PATENT DOCUMENTS 4,417,906 A * 11/1983 Ohno ................. B01J 3/062
264/654
2012/0091856 A1   4/2012 Tsuji et al.
(Continued)

FOREIGN PATENT DOCUMENTS

DE    11 2017 001 546 T5    12/2018
DE    11 2017 005 977 T5     9/2019
(Continued)

OTHER PUBLICATIONS

English Translation of the International Preliminary Report on Patentability, issued in corresponding International Application No. PCT/JP2020/045500, dated Jun. 30, 2022 (5 pages).
(Continued)

*Primary Examiner* — J. San Martin
(74) *Attorney, Agent, or Firm* — Flynn Thiel, P.C.

(57) ABSTRACT

A vibrating plate-bonded body includes a supporting substrate composed of silicon, a vibrating plate composed of a highly rigid ceramics and having a thickness of 100 μm or smaller, and a bonding layer between the supporting substrate and vibrating plate, contacting a bonding surface of the vibrating plate and composed of α-Si. The arithmetic average roughness Ra of the bonding surface of the vibrating plate is 0.01 nm or more and 10.0 nm or less, and the pit density of the bonding surface of the vibrating plate is 10 counts or more per 100 μm$^2$.

7 Claims, 3 Drawing Sheets

(51) Int. Cl.
    *H01L 41/187*     (2006.01)
    *G02B 26/08*     (2006.01)

(56)     References Cited

U.S. PATENT DOCUMENTS

| | | |
|---|---|---|
| 2012/0146023 A1 | 6/2012 | Craft et al. |
| 2017/0279435 A1 | 9/2017 | Geshi et al. |
| 2019/0036009 A1 | 1/2019 | Tai et al. |
| 2019/0222189 A1 | 7/2019 | Tai et al. |
| 2019/0288660 A1 | 9/2019 | Goto et al. |

FOREIGN PATENT DOCUMENTS

| | | |
|---|---|---|
| JP | 2004347769 A | 12/2004 |
| JP | 201237578 A | 2/2012 |
| JP | 2014507363 A | 3/2014 |
| JP | 201486400 A | 5/2014 |
| WO | 2016159393 A1 | 10/2016 |
| WO | 2019054238 A1 | 3/2019 |

OTHER PUBLICATIONS

International Search Report with English Translation issued in corresponding International Application No. PCT/JP2020/045500 dated Feb. 2, 2021 (5 pages).
Written Opinion of International Searching Authority issued in corresponding International Application No. PCT/JP2020/045500 dated Feb. 2, 2021 (3 pages).
Wikipedia article "Versetzungsdichte"/engl. etch pit density/, with English translation (6 pages).
Office Action issued by the German Patent and Trade Mark Office in corresponding German Application No. 11 2020 001 781.8, with English translation, dated Nov. 29, 2021 (13 pages).

* cited by examiner

VIBRATING PLATE-BONDED-BODY

CROSS-REFERENCE TO RELATED APPLICATIONS

This is a continuation of PCT/JP2020/045500, filed Dec. 7, 2020, which claims priority to Japanese Application No. JP2019-228202 filed on Dec. 18, 2019, the entire contents of which are hereby incorporated by reference.

TECHNICAL FIELD

The present invention relates to a bonded body which can be used for a MEMS (Micro Electro Mechanical System) mirror or the like and produced by bonding a vibrating plate of a highly-rigid ceramics to a supporting substrate.

BACKGROUND ART

A head up display (HUD) is a system for displaying necessary information overlapping in a visual field while line of sight is maintained in forward-looking mode. In the case of driving an automobile, as the information can be visualized while the line of sight is maintained in the forward-looking mode than the case that the information on a meter panel or console panel is watched, it is possible to effectively prevent aside driving and further, as a fewer focus shift of eyes is necessary, it is possible to reduce fatigue of a driver and to improve the safety.

It will be described the principle of the HUD. An image from a fluorescent tube, CRT or liquid crystal display is displayed on a front glass or a transparent screen (combiner) of the automobile. Here, the HUD includes the following two system due to the difference of the optical structures.
(1) Direct Projection system of directly projecting the image on the front glass or the like as a screen.
(2) Virtual Imaging system of imaging the image on the retina of the driver by the front glass or the like as a reflecting mirror.

The major difference between these systems is the feeling of distances when the driver watches the image. According to the Direct Projection system, the image is recognized on the screen (combiner) as a conventional projector. According to the Virtual Imaging system, the image is recognized in a space a few meters away on the line of sight of the driver. According to both systems, the shift of the line of sight is considerably reduced between the forward visual field of the driver and meter panel or console, compared with the case that the HUD is not used. However, according to the Virtual Imaging system, as the focus shift from the visual field during normal driving is made small, the driver can concentrate more on the driving to reduce the fatigue. According to the Virtual Imaging system, it has been promoted the development of a new system of scanning laser beam for the imaging.

According to laser scanning type display, laser beams of three colors RGB are combined through an optical device called a combiner to provide a single beam, which is reflected by a micro mirror to perform the scanning two-dimensionally and the imaging. Although it is similar to electron beam scanning of CRT, instead of exciting a phosphor, the pulse width and output of the respective laser beams are controlled at positions corresponding with the respective pixels on the horizontal scan lines to change the color and brightness so that the pointillism of the pixels is performed at a high speed. Resolution which can be realized is determined by the vibrational frequency of the mirror and modulation frequency of the laser.

Major advantages of the system include the followings.
(1) As a number of parts is low, miniaturization, cost reduction and improvement of reliability can be realized.
(2) As the laser can be illuminated at a brightness required for each pixel, low consumption of electric force can be realized.
(3) As it is used the collimated laser light (parallel light), the adjustment of focus is unnecessary.

The micro mirror is a core part of the laser scanning type display and produced by processing Si by MEMS (Micro Electro Mechanical System) technique and by vapor deposition of a metal. The methods of driving the mirror may be electrostatic system of driving by electrostatic attraction, electromagnetic system of driving by electromagnetic force, or piezoelectric system of driving by a piezoelectric device. Among them, the advantages of the piezoelectric system include driving at a high speed, lower consumed electric power and large driving force, and the defects include the difficulty of film-formation of the piezoelectric device. For example, it is proposed a MEMS mirror applying an SOI substrate (Patent document 1).

RELATED ARTS (Patent document 1) Japanese patent publication No. 2012-037578A (Patent document 2) Japanese patent publication No. 2014-086400A

SUMMARY OF THE INVENTION

It is demanded the increase of the display size and angle of view for the HUD until now, and even it is demanded to enlarge the angle of view form conventional 7 to 8 degrees to the maximum of 20 degrees. For realizing the increase of display size and angle of view, it is necessary to improve the frequency, amplitude and reliability of the piezoelectric element of the MEMS mirror. Particularly, it is demanded the increase of the width and speed of the scanning. However, such objects cannot be realized by prior piezoelectric elements formed on an Si substrate.

Thus, it was tried to apply a highly rigid ceramic plate as a vibrating plate positioned under a piezoelectric layer, However, for applying the highly rigid ceramic plate as such vibrating plate, it is necessary to make the thickness of the highly rigid ceramic plate 100 μm or less and thus to increase the vibration frequency. However, in the case that the thickness of the highly rigid ceramic plate is 100 μm or less, the mechanical strength is insufficient. It is thus tried to subject the highly rigid ceramic plate to polishing to a thickness of 100 μm or less, after the highly rigid ceramic plate is bonded to a supporting substrate to obtain a bonded body.

However, as it was actually tried the production, it was found that the highly rigid ceramics is hard to process and a load during the processing (shear stress) is large, resulting in problems such as peeling, cracks or the like. It was further tried to incorporate a bonding layer between the vibrating plate and supporting substrate for improving the bonding strength of the vibrating plate and supporting substrate and to roughen the surface of the vibrating plate for improving the adhesive force between the vibrating plate and bonding layer. However, in the case that the surface of the vibrating plate is roughened, it is considered that the bending strength of the vibrating plate is lowered. It is thus difficult to prevent the peeling and cracks in the bonded body of the vibrating plate made of the highly rigid ceramics and supporting substrate.

An object of the present invention is to provide a bonded body of a vibrating plate composed of a highly rigid ceramics and having a thickness of 100 µm or less and a supporting substrate, in which the bonded body has the structure of maintaining the strength of the vibrating plate and of preventing the peeling and cracks of the vibrating plate.

The present invention provides a vibrating plate-bonded body comprising:

a supporting substrate comprising silicon;

a vibrating plate comprising a highly rigid ceramics and having a thickness of 100 µm or less; and a bonding layer between said supporting substrate and said vibrating plate, contacting a bonding surface of said vibrating plate and comprising α-Si, wherein said bonding surface of said vibrating plate has an arithmetic average roughness Ra of 0.01 nm or more and 10.0 nm or less, and wherein said bonding surface of said vibrating plate has a pit density of 10 counts or more per 100 µm$^2$.

Further, the present invention provides a method of producing a vibration plate-bonded body, the method comprising the steps of:

providing a bonding layer on a surface of a highly rigid ceramic plate comprising a highly rigid ceramics, said bonding layer comprising α-Si;

then bonding a bonding surface of said bonding layer and a bonding surface of a supporting substrate comprising silicon; and then processing said highly rigid ceramic plate to obtain a vibrating plate having a thickness of 100 µm or less, wherein said surface of said highly rigid ceramic plate has an arithmetic average roughness Ra of 0.01 nm or more and 10.0 nm or less, and wherein said surface of said highly rigid ceramic plate has a pit density of 10 counts or more per 100p m$^2$.

In the case that a highly rigid ceramic plate of bulk type is directly bonded to a supporting substrate composed of silicon, the highly rigid ceramic plate cannot endure the polishing process for polishing the highly rigid ceramic plate to a thickness of 100 µm or less, resulting in the peeling or cracks of the highly rigid ceramic plate. Thus, the inventors tried to provide a bonding layer of α-Si on the highly rigid ceramic plate of bulk type and to bond the bonding layer onto the supporting substrate composed of silicon. The bonding layer of α-Si is provided for reducing the cost of etching process for providing hollow structure in the vibrating plate, for example. As the bonding strength of the bonding layer composed of α-Si and the supporting substrate composed of silicon is high, the highly rigid ceramic plate should have endured the processing of polishing the highly rigid ceramic plate to a thickness of 100 µm or less.

However, when the polishing is performed, it is considered that fracture or cracks may occur at the interface of the highly rigid ceramic plate and bonding layer. That is, as a bending strength is required for the highly rigid ceramic plate, it is necessary to flatten the surface of the highly rigid ceramic plate. However, in the case that the surface of the highly rigid ceramic plate is flat, as the adhesion of the surface onto the surface of the bonding layer (amorphous silicon) provided thereon is deteriorated, the probability of the peeling or cracks should be higher at the flat interface between the highly rigid ceramic plate and bonding layer.

Considering the above, as the inventors tried to improve the flatness of the surface (bonding surface on which the bonding layer is to be provided) of the highly rigid ceramic plate, it is found that the peeling or cracks at the interface of the bonding layer during the polishing is suppressed depending on cases, even when the bonding surface is flat.

The inventors further researched the vibrating-plate bonded body exhibiting the characteristics beyond expectations. As a result, even in such case that the arithmetic average roughness (Ra) of the flat bonding surface of the highly rigid ceramic plate is extremely low, it is found that the pits are left on the bonding surface due to fine voids depending on the physical properties of the highly rigid ceramic plate and that the peeling is suppressed by the effects of the surface pits. The present invention is thus made.

That is, in the case that the arithmetic average roughness Ra of the bonding surface of the vibrating plate exceeds 10.0 nm, the bending strength of the vibrating plate in the vibration is low, so that it cannot endure the vibration at high amplitude and high frequency. Ra is thus made 10.0 nm or lower to provide an ultra-flat surface. Even in this case, it is proved that the cracks or peeling of the vibrating plate during the polishing process can be prevented, by making the pit density of the bonding surface of the vibrating plate 10 counts or more per 100 µm$^2$.

BEST MODES FOR CARRYING OUT THE INVENTION

Figure 1A:
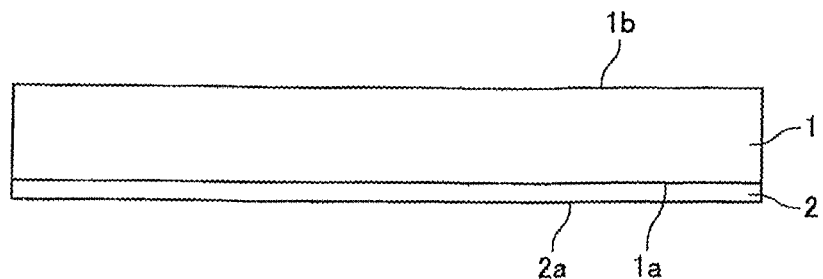
FIG. 1(a) shows the state that a bonding layer 2 is provided on a bonding surface 1a of a highly rigid ceramic plate 1.

The present invention will be described further in detail below, appropriately referring to the drawings.

As shown in FIG. 1(a), a highly rigid ceramic plate 1 is prepared. The arithmetic average roughness Ra of a surface 1a of the highly rigid ceramic plate is made 0.01 nm or more and 10.0 nm or less, and the pit density of the surface of the highly rigid ceramic plate is made 10 counts or more per 100 µm$^2$. 1b represents a back surface of the highly rigid ceramic plate 1.

Figure 1B:
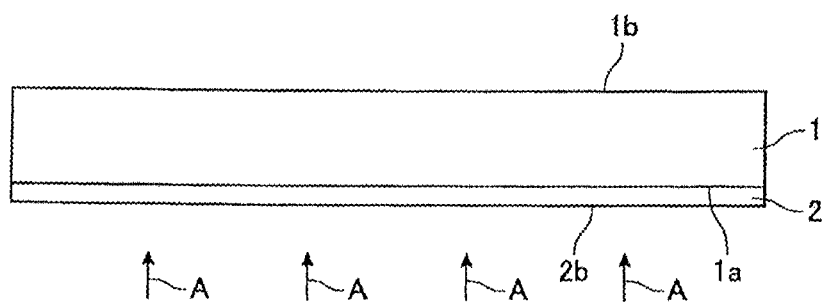
FIG. 1(b) shows the state that a surface 2b of the bonding layer 2 is activated by neutralized atomic beam.

A bonding layer 2 composed of α-Si is then film-formed on the surface 1a of the highly rigid ceramic plate 1. Then, as shown in FIG. 1(b), neutralized atomic beam is irradiated onto a bonding surface 2a of the bonding layer 2 as arrows A for the activation. Further, neutralized atomic beam is irradiated on a bonding surface 3a of the supporting substrate 3 as arrows B for the activation.

Figure 2A:
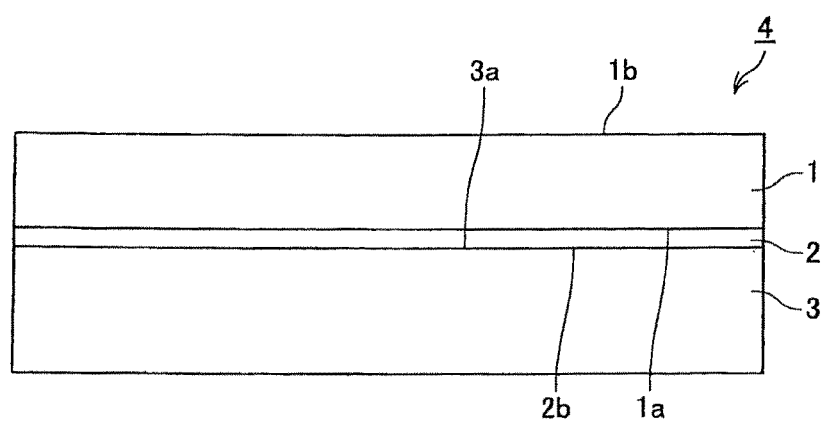
FIG. 2(a) shows a bonded body 4 of the highly rigid ceramic plate 1 and supporting substrate 3.
Figure 2B:
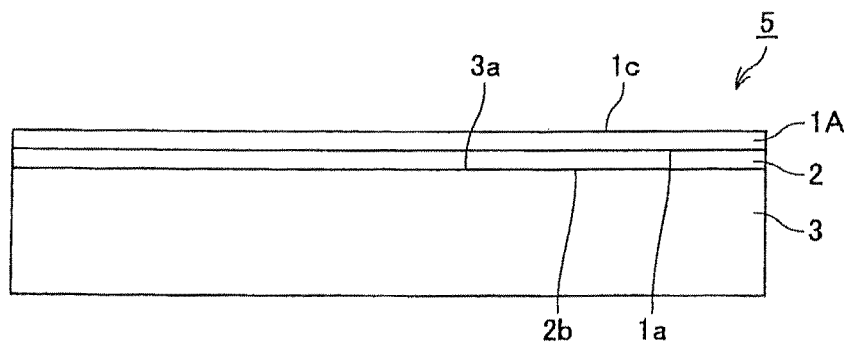
FIG. 2(b) shows a bonded body 5 of a vibrating plate 1A and the supporting substrate 3.

Then, as shown in FIG. 2(a), the activated bonding surface 2b of the bonding layer 2 and activated bonding surface 3a of the supporting substrate 3 are contacted and directly bonded with each other to obtain a bonded body 4. The back surface 1b of the highly rigid ceramic plate 1 of the bonded body 4 is then processed to make the thickness of the highly rigid ceramic plate smaller to form a vibrating plate 1A having a thickness of 100 μm or smaller, as shown in FIG. 2(b), to obtain a vibrating plate-bonded body 5. 1c represents a processed surface.

Although the thickness of the supporting substrate composed of silicon is not particularly limited, the thickness may preferably be 200 μm or larger and more preferably be 400 μm or larger, on the viewpoint of maintaining the strength during the processing. Further, the arithmetic average roughness Ra of the bonding surface of the supporting substrate may preferably be 1 nm or smaller and more preferably be 0.3 nm or smaller, on the viewpoint of facilitating the direct bonding.

The highly rigid ceramics is defined as a ceramic material having a Young's modulus of 200 GPa or larger and a 3-point bending strength of 300 GPa or larger.

The highly rigid ceramics may preferably be sialon, cordierite, mullite, translucent alumina, aluminum nitride, silicon nitride or silicon carbide.

Further, the thickness of the highly rigid ceramic plate may preferably be 100 μm or larger and more preferably be 200 μm or larger, on the viewpoint of handleability during the processes such as cleansing or bonding of the substrate. Further, although the upper limit of the highly rigid ceramic plate is not particularly limited, it may preferably be 300 μm or smaller on the viewpoint of reducing the time duration required for the processing.

According to the present invention, the arithmetic average roughness Ra of the surface (surface on which the bonding layer is provided) of the vibrating plate is 0.01 nm or more and 10.0 nm or less, and the pit density on the surface of the vibrating plate is 10 counts or more per 100p m$^2$. However, as the bonding layer is formed on the vibrating plate of the vibrating plate-bonded body, the Ra and pit density of the surface of the vibrating plate is to be same as the Ra and pit density of the surface of the highly rigid ceramic plate before the processing.

The arithmetic average roughness Ra of each of the surfaces of the highly rigid ceramic plate and vibrating plate is measured as follows. First, the surface is measured by means of an atomic force microscope (AFM) in a visual field of 10 μm×10 μm, and Ra is calculated according to JIS B 0601. Further, the number of the pits counted in the same measured visual field (area of 100 μm$^2$). Here, the standard for judging the pits is made as follows. That is, among recesses observed on the surface, the pit is defined as follows.
(1) The recess has Φ of 50 nm or larger and 2000 nm or smaller.
(2) The depth of the recess is 1 nm or larger.

According to the present invention, the arithmetic average roughnesses Ra of the surface of the vibrating plate and surface (surface on which the bonding layer is formed) of the highly rigid ceramic plate are made 0.01 nm or more and 10.0 nm or less, and may preferably be 7.0 nm or less and more preferably be 5.0 nm or less, on the viewpoint of the bending strength. Further, Ra is 0.01 nm or more and more preferably 0.02 nm or more, on the viewpoint of the adhesion onto the bonding layer.

Further, the pit density of the surface of the vibrating plate is 10 counts or more, and preferably 20 counts or more, per 100 μm$^2$. Further, the pit density of the surface of the vibrating plate is usually 200 counts or less, preferably 96 counts or less and most preferably 70 counts or less, per 100 μm$^2$.

It is considered that the pits present on the surfaces, facing the bonding layer, of the vibrating plate and highly rigid ceramic plate are generated due to sintering aid added for sintering the highly rigid ceramic plate densely. Substantial portion of the excessive sintering aid after the sintering is present in the form of aggregation in the intergranular boundaries between the ceramic grains. In the case that the highly rigid ceramics with the residual sintering aid is shaped into a wafer and then polished into a mirror surface, the rate of the polishing is higher in parts where the sintering aid is aggregated than in parts composed of the highly rigid ceramics itself. The pits are generated in the parts in which the sintering aid is aggregated. There is thus correlation between the amount of the sintering aid added and number of the pits, so that it is possible to adjust the number of the pits by adjusting the amount of the sintering aid added.

On the viewpoint of obtaining the bonding strength and low Ra of the highly rigid ceramic plate, the relative density of the highly rigid ceramic plate may preferably be 95% or higher and more preferably be 99% or higher. Further, the kind and amount of the sintering aid appropriate for obtaining the Ra and pit density described above are appropriately selected depending on the kind of the highly rigid ceramic ceramics to be sintered. For example, the sintering aid may be $Y_2O_3$, CaO, MgO or $ZrO_2$.

According to the present invention, the arithmetic average surface roughnesses Ra of the back surfaces (surfaces on which the bonding layer is not formed) of the vibrating plate and highly rigid ceramic plate may preferably be 0.01 nm or more and 10.0 nm or less, on the viewpoint of the bonding strength.

As to the method of polishing the surface of the highly rigid ceramic plate, for example, after it is ground to a desired thickness by means of a grinding stone of #3000, it is then lapped by means of diamond slurry of a grain size of 3 μm and finished into mirror surface by chemical mechanical polishing (CMP).

Although the thickness of the bonding layer 2 film-formed on the highly rigid ceramic plate is not particularly limited, the thickness may preferably be 0.01 to 10 μm and more preferably be 0.05 to 0.5 μm, on the viewpoint of production cost.

Although the method of film-forming the bonding layer 2 is not limited, sputtering method, chemical vapor deposition (CVD) method and vapor deposition method are exemplified.

The method of flattening the bonding surface of the bonding layer 2 and the bonding surface of the supporting substrate may be lapping, chemical mechanical polishing (CMP) or the like.

According to a preferred, the surface 2b of the bonding layer 2 and surface 3a of the supporting substrate 3 can be activated by neutralized atomic beam. Particularly, in the case that the surface 2b of the bonding layer 2 and surface 3a of the supporting substrate 3 are flat surfaces, the direct bonding can be easily made.

When the activation of the surfaces is performed using the neutralized beam, it is preferred to use a system described in Patent Document 2 to generate the neutralized beam, which is irradiated. That is, it is used a high-speed atomic beam source of saddle field type as the beam source. Then, inert gas is introduced into the chamber and a high voltage is applied onto electrodes from a direct current electric source. By this, electric field of saddle field type generated between the electrode (positive electrode) and a housing (negative electrode) causes motion of electrons, e, so that atomic and ion beams derived from the inert gas are generated. Among the beams reached at a grid, the ion beam is neutralized at the grid, and the beam of neutral atoms is emitted from the high-speed atomic beam source. The atomic specie providing the beam may preferably be an inert gas (argon, nitrogen or the like).

In the activation step by beam irradiation, the voltage may preferably be made 0.5 to 2.0 kV, and the current may preferably be made 50 to 200 mA.

Then, the activated surfaces are contacted and bonded with each other under vacuum atmosphere. The temperature at this time may be ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

Then, the highly rigid ceramic plate is processed to obtain the vibrating plate having a thickness of 100 μm or smaller. As the thickness of the vibrating plate is selected depending on the target frequency, the lower limit of thickness is not particularly limited, and the thickness may preferably be 1 μm or larger on the viewpoint of ease of the processing. As to the processing method, for example, after it is ground to a desired thickness by means of a grinding stone of #3000, it is subjected to lapping by means of diamond slurry of a grain size of 3 μm and then finished into a mirror surface by chemical mechanical polishing (CMP).

EXAMPLES

Inventive Examples 1 to 8

Figure 1C:
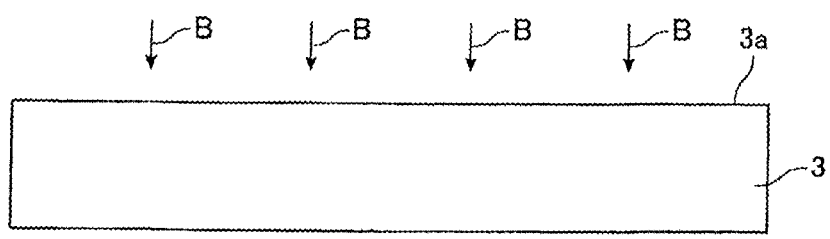
FIG. 1(c) shows the state that a bonding surface 3a of a supporting substrate 3 is activated by neutralized atomic beam.

The vibrating plate-bonded body was produced, as described referring to FIGS. 1 and 2.

Specifically, a sialon substrate of a wafer shape having a diameter of 4 inches and thickness of 250 μm was used as the highly rigid ceramic substrate 1. Each surface 1a of each highly rigid ceramic plate 1 was ground to a desired thickness by means of a grinding stone of #3000, and, in the case of the surface of the vibrating plate shown in table 1 (Ra≤1 nm), the surface was lapped by diamond slurry of a grain size of 3 μm, followed by finishing by chemical mechanical polishing (CMP) into a mirror surface, so that the arithmetic average roughness Ra was adjusted at each numerical value shown in tables 1, 2 and 3. For adjusting the numerical values of Ra, the pressure and time of the processing during the CMP polishing were adjusted. In the case of the surface (Ra>1 nm) of the vibrating plate shown in table 2, the surface was lapped by diamond slurry into a mirror surface. For adjusting the numerical value of Ra, the grain size of the diamond slurry used for the finishing was selected in a range of 0.5 μm to 6 μm.

Further, Ra of the surface 1a of the highly rigid ceramic vibrating plate 1 was measured in a visual field of 10 μm×10 μm by means of an atomic force microscope (AFM). Further, at this time, the number of the pits of Φ 50 nm or larger was counted by means of an atomic force microscope (AFM) in a visual field of 10 μm×10 μm. However, in the case that the number of the pits on the surface 1a of the highly rigid ceramic plate 1 was measured, the numbers of the pits were measured at the three positions of the central point of the wafer-shaped plate 1, of the point inside of a orientation flat by 10 mm of the plate 1 and of the point inside by 10 mm of the end opposite to the orientation flat of the plate 1. The average value of the measured values at the three points was defined as the pit density, which was shown in table 1, 2 or 3.

Figure 3:
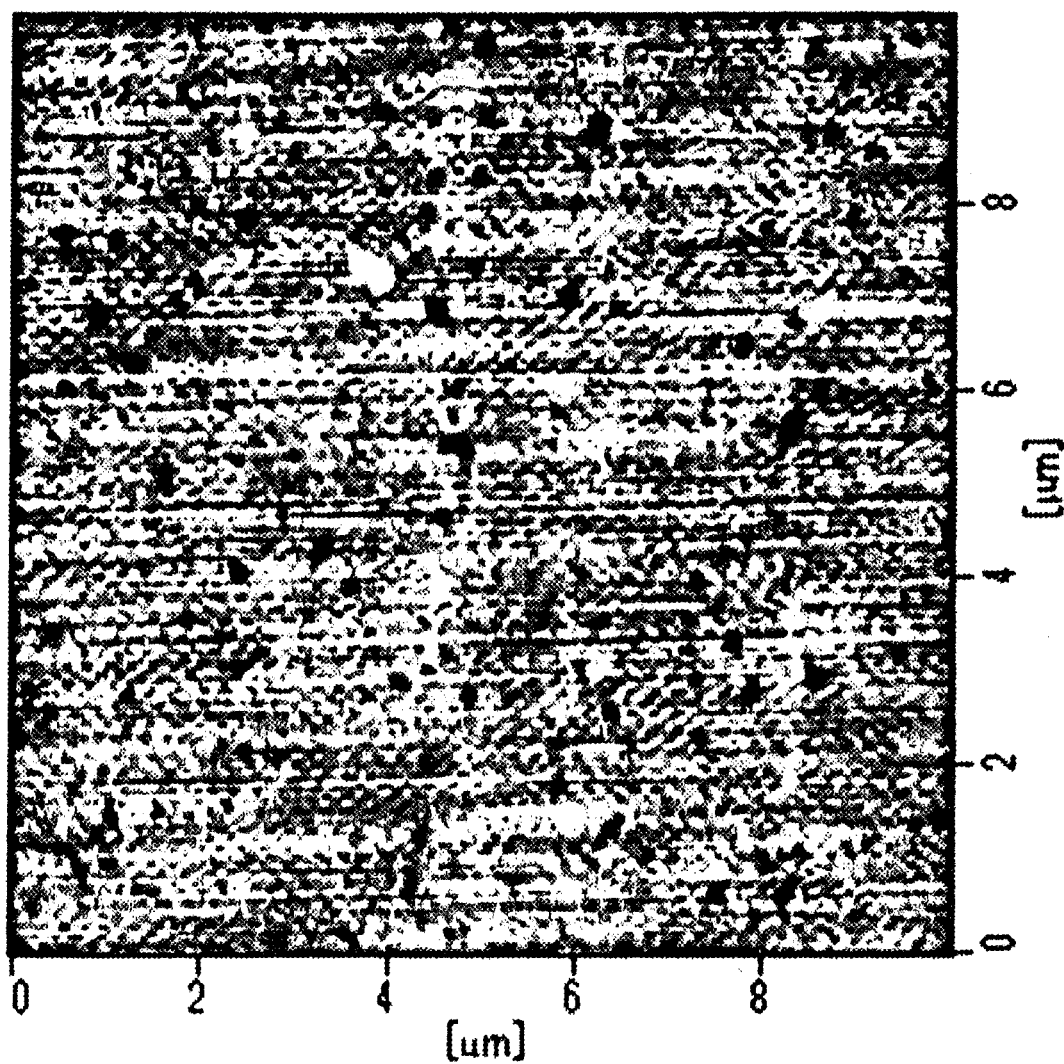
FIG. 3 is an image measured by an AFM and showing the state of surface pits on a bonding surface of the highly rigid ceramic plate.

Further, FIG. 3 shows the state of the surface of the highly rigid ceramic plate used in the inventive example 4 (Ra=0.07 nm, pit density in the visual field of 10 μm×10 μm=58 counts).

Further, the bending strength of each of the examples of the highly rigid ceramic plates cannot be measured in the substrate after the bonding. It was thus prepared each highly rigid ceramic plate 1 having the same material, thickness, pit density and Ra as those of each of the examples of the highly rigid ceramic plates 1, and each test piece was cut out from each of the highly rigid ceramic plates and was subjected to the measurement of the three-point bending strength. The bending strength was measured according to the standard of the three-point bending strength described in JIS R 1601 (method of testing bending strength at room temperature of fine ceramics). As to the sizes of the test piece, the length, width and thickness of the piece were 40.0 mm, 4.0 mm and 3.0 mm, respectively.

Then, the bonding layer 2 was film-formed on the surface 1a of the highly rigid ceramic plate 1 by direct current sputtering method. Si doped with boron was used as a target. The thickness of the bonding layer 2 was made 30 to 200 nm. The arithmetic average roughness Ra of the surface 2a of the bonding layer 2 was 0.2 to 0.6 nm. The bonding layer 2 was then subjected to chemical mechanical polishing (CMP) to make the film thickness 20 to 150 nm and Ra 0.08 to 0.4 nm.

Further, as the supporting substrate 3, it was prepared the supporting substrate 3 having an orientation flat (OF) part, a diameter of 4 inches, a thickness of 500 μm and composed of silicon. The surface of the supporting substrate 3 was finished by chemical mechanical polishing (CMP) and the arithmetic average roughness Ra was 0.2 nm.

Then, after the surface 2b of the bonding layer 2 and surface 3a of the supporting substrate 3 were cleansed to remove the contamination, the substrate was introduced into a vacuum chamber. After it was evacuated to the order of $10^{-6}$ Pa, high-speed atomic beam was irradiated onto the respective surfaces (acceleration voltage of 1 kV, and Ar flow rate of 27 sccm) for 120 seconds. Then, after the activated surface 2b of the bonding layer 2 and the activated surface 3a of the supporting substrate 3 were contacted with each other, the substrates were bonded upon pressurizing with each other at 10000N for 2 minutes (FIG. 2(a)). The thus bonded bodies of the respective examples were heated at 100° C. for 20 hours.

Then, the back surface 1b of the highly rigid ceramic plate 1 was subjected to grinding and polishing from the initial 250 μm to 40 μm (refer to FIG. 2(b)).

TABLE 1

|  |  | Inventive Example 1 | Inventive Example 2 | Inventive Example 3 | Inventive Example 4 |
|---|---|---|---|---|---|
| Materials | Vibrating plate | Sialon | Sialon | Sialon | Sialon |
|  | Bonding layer | α-Si | α-Si | α-Si | α-Si |
|  | Supporting substrate | Si | Si | Si | Si |

TABLE 1-continued

|  | Inventive Example 1 | Inventive Example 2 | Inventive Example 3 | Inventive Example 4 |
|---|---|---|---|---|
| Number of pits on surface of vibrating plate (counts) | 10 | 45 | 96 | 58 |
| Ra on surface of vibrating plate (nm) | 0.02 | 0.03 | 0.04 | 0.07 |
| Peeling of vibrating plate and supporting substrate during processing of vibrating plate | No peeling at a thickness of 40 μm of vibrating plate | No peeling at a thickness of 40 μm of vibrating plate | No peeling at a thickness of 40 μm of vibrating plate | No peeling at a thickness of 40 μm of vibrating plate |
| Bending strength of vibrating plate (MPa) | 705 | 700 | 695 | 690 |

TABLE 2

|  |  | Inventive Example 5 | Inventive Example 6 | Inventive Example 7 | Inventive Example 8 |
|---|---|---|---|---|---|
| Materials | Vibrating plate | Sialon | Sialon | Sialon | Sialon |
|  | Bonding layer | α-Si | α-Si | α-Si | α-Si |
|  | Supporting substrate | Si | Si | Si | Si |
| Number of pits on surface of vibrating plate (counts) |  | 53 | 12 | 55 | 94 |
| Ra on surface of vibrating plate (nm) |  | 4.98 | 9.97 | 9.96 | 9.94 |
| Peeling of vibrating plate and supporting substrate during processing of vibrating plate |  | No peeling at a thickness of 40 μm vibrating plate | No peeling at a thickness of 40 μm vibrating plate | No peeling at a thickness of 40 μm vibrating plate | No peeling at a thickness of 40 μm vibrating plate |
| Bending strength of vibrating plate (MPa) |  | 640 | 500 | 500 | 900 |

TABLE 3

|  |  | Comparative Example 1 | Comparative Example 2 | Comparative Example 3 |
|---|---|---|---|---|
| Structure | Vibrating plate | Sialon | Sialon | Sialon |
|  | Bonding layer | — | α-Si | α-Si |
|  | Supporting substrate | Si | Si | Si |
| Number of pits on surface of vibrating plate (counts) |  | 51 | 4 | 55 |
| Ra on surface of vibrating plate (nm) |  | 0.03 | 0.01 | 10.85 |
| Peeling of vibrating plate and supporting substrate during processing of vibrating plate |  | Peeling at a thickness of 110 μm of vibrating plate | Peeling at a thickness of 100 μm of vibrating plate | No peeling at a thickness of 40 μm of vibrating plate |
| Bending strength of vibrating plate (MPa) |  | — | — | 300 |

According to the inventive examples 1 to 8, as the pit density was 10 to 96 counts and Ra was 0.02 to 9.97 nm, the peeling was completely prevented even in the case that the vibrating plate 1A was polished to a thickness of 40 μm. Although the bending strength of the ceramics tends to be lower as Ra is larger, the result of the bending strength was proved to be sufficiently as high as 500 MPa, even in the case that Ra was 9.97 nm.

Comparative Example 1

According to the comparative example 1, the bonding layer 2 composed of α-Si was not film-formed on the highly rigid ceramic plate 1. Instead, high-speed atomic beam was irradiated onto the surface 1a of the highly rigid ceramic plate 1, and the activated surface 1a of the highly rigid ceramic plate 1 and activated surface 3a of the supporting substrate 3 were contacted and bonded with each other to obtain a bonded body. However, the number of the pits and Ra of the surface 1a of the highly rigid ceramic plate 1 of the comparative example 1 were 51 counts and 0.03 nm, respectively. Further, it was produced under the same conditions as those of the inventive example 1, except that the bonding layer of α-Si was not film-formed.

The back surface 1b of the highly rigid ceramic plate 1 of the thus obtained bonded body was then subjected to grinding and polishing so that the thickness was thinned from the initial 250 μm. In the case that the thickness of the highly rigid ceramic plate 1 reached 110 μm, the peeling was observed at the bonding interface between the highly rigid ceramic plate and supporting substrate. The cause of the peeling is considered as follows. The bonding strength of the highly rigid ceramic plate 1 and supporting substrate 3 of the bonded body was lower than the bonding strengths obtained in the inventive examples 1 to 8, so that the bonded body could not endure the processing stress during the polishing of the highly rigid ceramic plate 1.

Comparative Examples 2 and 3

The respective bonded bodies of the comparative examples 2 and 3 were produced under the same conditions as those of the inventive examples 1 to 8.

However, according to the comparative example 2, the number of the pits of the surface 1a of the highly rigid ceramic plate 1 was as low as 4 counts, and Ra of the surface 1a was proved to be 0.01 nm. In this case, in the case that the back surface of the highly rigid ceramic plate 1 was thinned by grinding and polishing until the thickness reached 100 μm, the peeling was observed at the interface between the surface of the highly rigid ceramic plate 1 and the surface of the bonding layer 2. It is considered that the adhesion strength of the highly rigid ceramic plate 1 and bonding layer 2 could not endure the processing stress applied during the polishing of the highly rigid ceramic plate 1.

Further, according to the inventive examples 1 to 4, the peeling was not observed, even in the case that the Ra of the surface at the ceramic interface was less than 0.2 nm and sufficiently low. It is speculated that the pits were present on the surface 1a of the highly rigid ceramic plate 1 and the bonding layer 2 film-formed over the pits exhibits anchor effect to improve the adhesive force.

According to the comparative example 3, although the number of the pits on the surface 1a of the highly rigid ceramic vibrating plate 1 was 55 counts, Ra on the surface 1a was 10.85 nm. In the case that Ra was 10.85 nm, the bending strength of the highly rigid ceramic plate was lowered to 300 MPa. It is considered that a stress is concentrated onto the roughness present on the surface of the highly rigid ceramic plate to reduce the bending strength.

The invention claimed is:

1. A vibrator plate-bonded body comprising:
   a supporting substrate comprising silicon;
   a vibrating plate comprising a highly rigid ceramics and having a thickness of 100 μm or smaller; and
   a bonding layer present between said supporting substrate and said vibrating plate, contacting a surface of said vibrating plate and comprising α-Si,
   wherein said surface of said vibrating plate has an arithmetic average roughness Ra of 0.01 nm or more and 10.0 nm or less, and
   wherein said surface of said vibrating plate has a pit density of 10 counts or more per 100 μm$^2$.

2. The vibrator plate-bonded body of claim 1, wherein said bonding layer and said supporting substrate are directly bonded.

3. The vibrator plate-bonded body of claim 1, wherein said highly rigid ceramics is selected from the group consisting of sialon, cordierite, mullite, translucent alumina, aluminum nitride, silicon nitride and silicon carbide.

4. A method of producing a vibrator plate-bonded body, said method comprising the steps of:
   providing a bonding layer comprising α-Si on a surface of a highly rigid ceramic plate of a highly rigid ceramics;
   then bonding a bonding surface of said bonding layer and a bonding surface of a supporting substrate comprising silicon; and
   then processing said highly rigid ceramic plate to obtain a vibrating plate having a thickness of 100 μm or smaller,
   wherein said surface of said highly rigid ceramic plate has an arithmetic average roughness Ra of 0.01 nm or more and 10.0 nm or less, and
   wherein said surface of said highly rigid ceramic plate has a pit density of 10 counts or more per 100 μm$^2$.

5. The method of producing a vibrator plate-bonded body of claim 4, the method further comprising the step of directly bonding said bonding surface of said bonding layer and said bonding surface of said supporting substrate.

6. The method of producing a vibrator plate-bonded body of claim 5, the method further comprising the step of activating said bonding surface of said bonding layer and said bonding surface of said supporting substrate by a neutralized atomic beam, wherein said bonding surfaces are then directly bonded.

7. The method of producing a vibrator plate-bonded body of claim 4, wherein said highly rigid ceramics is selected from the group consisting of sialon, cordierite, mullite, translucent alumina, aluminum nitride, silicon nitride and silicon carbide.

* * * * *